United States Patent [19]
Nakai et al.

[11] Patent Number: 6,028,794
[45] Date of Patent: Feb. 22, 2000

[54] NONVOLATILE SEMICONDUCTOR MEMORY DEVICE AND ERASING METHOD OF THE SAME

[75] Inventors: Hiroto Nakai; Kaoru Tokushige, both of Yokohama, Japan

[73] Assignee: Kabushiki Kaisha Toshiba, Kawasaki, Japan

[21] Appl. No.: 09/007,788

[22] Filed: Jan. 15, 1998

[30] Foreign Application Priority Data

Jan. 17, 1997 [JP] Japan .................................. 9-006475

[51] Int. Cl.[7] .................................................. G11C 16/04
[52] U.S. Cl. .............................. 365/185.29; 365/185.11; 365/185.22
[58] Field of Search .......................... 365/185.29, 185.11, 365/185.22

[56] References Cited

U.S. PATENT DOCUMENTS

| | | | |
|---|---|---|---|
| 5,297,029 | 3/1994 | Nakai et al. ........................... | 365/238.5 |
| 5,428,569 | 6/1995 | Kato et al. ............................ | 365/185.26 |
| 5,583,809 | 12/1996 | Noguchi et al. ..................... | 365/185.11 |
| 5,594,689 | 1/1997 | Kato ..................................... | 365/185.22 |
| 5,615,148 | 3/1997 | Yamamura et al. ................. | 365/185.11 |

*Primary Examiner*—David Nelms
*Assistant Examiner*—Hoai V. Ho
*Attorney, Agent, or Firm*—Loeb & Loeb LLP

[57] ABSTRACT

A nonvolatile semiconductor memory device comprises a plurality of nonvolatile memory cells, which can be electrically programmed and erased, the plurality of nonvolatile memory cells divided into a plurality of blocks, a block erase circuit for erasing the plurality of nonvolatile memory cells contained in the plurality of blocks at the same time per block, erase operation times storage section for storing the number of erase operations of the nonvolatile memory cells to be erased at the same time by the block erase circuit per block in a number of erase operation storage region, and read time setting section for setting the read time based on the number of the erase operations stored in the number of erase operation storage region at the time of reading the storage data in the nonvolatile memory cells.

20 Claims, 9 Drawing Sheets

NONVOLATILE SEMICONDUCTOR MEMORY DEVICE AND ERASING METHOD OF THE SAME

BACKGROUND OF THE INVENTION

The present invention relates to a nonvolatile semiconductor memory device to be electrically programmed or erased, and an erasing method thereof.

Recently, various kinds of flash memories using a cell transistor with a floating gate structure have been proposed. This kind of a flash memory can be programmed or erased by providing a thin insulating film of about 10 nm between a substrate and a floating gate, and injecting or pulling out electrons to or from the floating gate via the insulating film. As a flash memory, the NOR type and the NAND type have already been developed. The NAND type flash memory is advantageous in that the size of the memory cell can be smaller to realize a lower cost compared with the NOR type. Since the NAND type flash memory needs little electric current in writing, memory cells of several k-bit can be programmed at the same time so that a high programming speed can be realized. Concerning the NAND type flash memory, various articles have been known. Examples thereof include the U.S. Pat. No. 5,297,029 by the present inventor, which discloses the basic operations such as reading, writing and erasing.

FIG. 1 is a circuit diagram schematically showing the memory cell in the above-mentioned NAND type flash memory and a surrounding circuit section relating to the reading operation.

In the NAND type flash memory, electric current paths of a plurality of memory cells MC1 to MCn are connected in series. To the source end and the drain end of the series-connected electric current path, a source select gate (select transistor) ST1 and a drain select gate (select transistor) ST2 are connected, respectively with a plurality of NAND bundles 11. The source end of the electric current path at the NAND bundle 11 is connected to a power source Vss and the drain end is connected to a bitline BL, respectively. An electric current path of a pre-charge transistor PT to be on/off controlled by a signal SA is connected between the bitline BL and a voltage supply source VPR. One end of an electric current path of a transistor DT to be on/off controlled by a signal SB is connected to the bitline BL. The other end of the electric current path of the transistor DT is connected to a sense amplifier resister circuit 16 comprising an inverter INV1 and an inverter INV2.

Although it is not illustrated, a plurality of NAND bundles are connected to the above-mentioned bitline BL in the row direction, and a plurality of bitlines are connected thereto in the column direction. To each of the bitlines, a plurality of NAND bundles are connected in the row direction. As in FIG. 1, a precharge transistor PT, a transistor DT and a sense amplifier and register circuit 16 are connected to each bitline.

To a control gate of each memory cell MC1 to MCn in the NAND bundle 11, word lines WL1 to WLn arranged normal to the bitline BL are connected per row. To the gate of each select transistor ST1, ST2, select lines SGS, SGD are connected per row. By applying a power source voltage Vcc to the select lines SGS, SGD, the select transistors ST1, ST2 are switched on, and a group of the NAND bundles arranged in the column direction is selected. To a selected word line WLm (m denotes any of 1 to n), 0 V is applied and to a non-selected word line in the NAND bundles, the power source voltage Vcc is applied. In other words, 0 V is applied to the control gate of the selected memory cell, and the power source voltage Vcc is applied to the control gate of the non-selected memory cell, respectively. Accordingly, if the threshold voltage of the selected memory cell is positive, the memory cell is in the off state, and if it is negative, the memory cell is in the on state. On the other hand, 0 V is supplied to the control gate of the non-selected memory cell in the NAND bundles and to the gate of the non-selected select transistor, respectively.

In the above-mentioned configuration, the read operation is carried out as shown in the timing chart of FIG. 2.

When starting the read (time t0), the signal SA is at the "H" level (at this time the signal SB is at the "L" level), the precharge transistor PT is in the on state, and the transistor DT is in the off state so that the bitline BL is precharged by the voltage supply source VPR. Then in the period between the signal SA is at the "L" level and the precharge transistor PT becomes off at the time t1, and the signal SB is at the "H" level and the transistor DT becomes at on state at the time t2, the potential of the bitline BL changes according to the threshold voltage (according to whether the selected memory cell is in the write state of the erase state) of the selected memory cell. When the signal SB becomes "H" level at the time t2, the transistor DT becomes at on state so that the bitline BL and the sense amplifier and register circuit 16 are connected to amplify the potential of the bitline BL to be latched to the sense amplifier and register circuit 16.

When electrons are injected to the floating gate of the selected memory cell MCm (write state), the threshold voltage of the memory cell MCm becomes high so that the memory cell MCm maintains the off state. Accordingly, the electric current does not flow from the bitline BL to the power source Vss via the selected NAND bundles so that the potential of the bitline BL does not lower. On the other hand, since the threshold voltage of the selected memory cell MCm is low when electrons are pulled out from the floating gate (erase state), the MCm is in the on state (at this time, a non-selected memory cell is also on). Accordingly, the electric current flows from the bitline BL to the power source Vs via the selected NAND bundles so that the potential of the bitline BL lowers. The potential of the bitline BL at the time t2 is supplied to the sense amplifier register circuit 16 so as to be latched as the memory data of the selected memory cell MCm.

Herein the operation until the memory data of the memory cell MCm is latched to the sense amplifier register circuit 16 is defined as the page read operation.

Usually, a sense amplifier register circuit 16 is connected to each bitline BL. In the case of a 16 Mbit NAND type EEPROM, about 2,000 pieces of the sense amplifier register circuits 16 are provided. The read operation of the data of the memory cell stored in the sense amplifier register circuit 16 to the outside is referred to as the serial read operation. By selectively switching on the column gate transistor (not illustrated) connected to the sense amplifier register circuit 16, the content of the sense amplifier register circuit 16 at a certain address can be read out to the outside.

In the above-mentioned NAND type flash memory, it is known that by the repetition of the programming and erase operations, electrons are trapped in the insulating film under the floating gate so that the threshold voltage of the memory cell after erasure becomes shallow (approaches to 0 V). FIG. 3 shows the result of dependency of the threshold voltage after erasure of a memory cell with respect to the number of programming/erase operations. From FIG. 3, it is leaned that the threshold voltage of the memory cell after the erase operation rises from about 100,000 times of the programming/erase operations, and the tendency becomes conspicuous from about 1,000,000 times. Therefore, after the 1,000,000 times programming/erase operations, in order to erase to the threshold voltage level the same as the up to 100,000 times level, the erase time needs to be longer. Accordingly, a conventional NAND type flash memory has a problem in that if programming and erase operations are repeated until the region where the oxide film of the memory cell wears the erase time becomes extremely long and thus actually it cannot be used until 1,000,000 times.

FIG. 4 shows the relationship between the threshold voltage of a memory cell after erasure and the page read time.

Usually, a bitline has a capacity of about several pF, and the read time is determined according to the speed of discharging the capacity. The discharge speed depends on the threshold voltage of the memory cell in the erase state. Therefore, by setting the read speed slower, even a little cell electric current can discharge the bitline charge of about several pF so that even a memory cell with a shallow threshold voltage can be judged as in the erase state. On the other hand, by setting the read speed faster, much cell electric current is required for the bitline charge discharge so that a deep threshold voltage is needed to be judged as in the erase state.

As mentioned above, in order not to have the erase time longer even after 1,000,000 times of writing and erasure, the read time can be set longer so that a memory cell with a shallow threshold voltage can be regarded as in the erase state. However, it involves a problem in that if the read speed is set to be slow in advance according to the shallow threshold voltage after 1,000,000 times programming and erasure, the access time to the memory chip becomes longer so that the performance of the NAND type flash memory is deteriorated.

As heretofore mentioned, conventional nonvolatile semiconductor memory device and erasing method thereof have a problem in that the threshold voltage of the memory cell after erasure becomes shallow after the repetition of programming and erase operations so as to dramatically prolong the erase time.

BRIEF SUMMARY OF THE INVENTION

An object of the present invention is to provide a nonvolatile semiconductor memory device capable of conducting an optimum erasure according to the number of the programming and erase operations, and restraining the prolongation of the erase time according to the increase of the number of the erase operations, and an erasing method thereof.

A nonvolatile semiconductor memory device according to a first aspect of the present invention comprises a plurality of nonvolatile memory cells, which can be electrically programmed and erased, the plurality of nonvolatile memory cells divided into a plurality of blocks; a block erase circuit for erasing the plurality of nonvolatile memory cells contained in the plurality of blocks at the same time per block; erase operation times storage section for storing the number of erase operations of the nonvolatile memory cells to be erased at the same time by the block erase circuit per block in a number of erase operation storage region; and read time setting section for setting the read time based on the number of the erase operations stored in the number of erase operation storage region at the time of reading the storage data in the nonvolatile memory cells. According to the first aspect, since the number of the erase operations carried out by the nonvolatile semiconductor memory device can be stored in the erase operation memory section and the read time can be controlled by the read time setting circuit according to the times of the erase operations, the read time can be set according to the number of the programming and erase operations of the nonvolatile semiconductor memory device so that the prolongation of the erase time can be restrained.

In the first aspect, it is preferable that (1) The read time setting section prolongs the page read time according to the increase of the number of erase operations stored in the number of erase operation storage region.

(2) The operation of reading the storage data in the nonvolatile memory cells having the next steps, 1) reading number of erase operations in the past, 2) deterring a discharge time of a bitline based on the read number of erase operations, and 3) latching data of a memory cell on the bitline after the determined time in a sense amplifier register.

(3) The block erase circuit comprises erase address storage section for storing the erase address inputted from the outside of the device, and an erase block select circuit for selecting the block to be erased based on the erase address stored in the erase address storage section.

(4) The erase operation times storage section comprises an erase operation counter incremented according to the number of erase operations.

(5) read time setting section includes a pulse generating circuit for generating a reference pulse for predetermined period, a counter circuit for counting generating times of the reference pulse, and a preparation circuit for preparing an output of the counter circuit with a predetermined value corresponding to the number of erase operations in the past, wherein if a preparation result is identified, the preparation circuit outputs a read termination signal, if not so, outputs a signal for generating a next reference pulse from the pulse generating circuit.

(6) A memory cell array is formed by arranging the nonvolatile memory cells in a matrix form, and the memory cell array comprises a data storage region for storing ordinary data and the number of erase operation times storage region for storing the number of erase operations of the memory cell in the past.

(7) The erase operation times storage region stores the number of erase operations in the past for each block corresponding to the data storage region.

(8) The erase operation times storage section comprises a temporary memory section for temporarily storing the number of erase operations, a flag data conversion section for converting the state flag data according to the number of erase operations, and a data input/output control section, to which the output signal from the temporary memory section and the output signal from the flag data conversion section are supplied, for controlling the programming of the state flag and the number of erase operations.

Accordingly, the block erase circuit can comprise an erase address storage section and an erase block select circuit.

A nonvolatile semiconductor memory device of a second aspect of the present invention comprises a plurality of nonvolatile memory cells, which can be electrically programmed and erased, the plurality of nonvolatile memory cells divided into a plurality of blocks; number of erase verify operation storage section for storing a number corresponding to the verify operations to be repeated until all the nonvolatile memory cells contained in the selected block are judged to be sufficiently erased in the erase verification; and read time setting section for setting the read time based on the number corresponding to the number of verify operations stored in the erase verify operation times storage section at the time of reading the storage data in the nonvolatile memory cells.

In the second aspect, it is preferred that (1) A memory cell array is formed by arranging the nonvolatile memory cells in a matrix form, and the memory cell array comprises a data storage region for storing ordinary data and a number of erase verify operation storage region for storing the number corresponding to the number of erase verify operations in the previous erase operation.

(2) The read time setting section prolongs the page read time according to the increase of the number of erase verify operations.

(3) The operation of reading the storage data in the nonvolatile memory cells having the next steps, 1) reading the number corresponding to the number of previous erase verify operations in previous erase operation, 2) deterring a discharge time of a bitline based on the read number of erase operations, and 3) latching data of a memory cell on the bitline after the determined time in a sense amplifier register.

(4) The number of erase verify operation storage section comprises a flag data conversion circuit for converting the state flag data according to the number of erase verify operations in previous erase operation, and a data input/output control circuit, to which the output signal from the flag data conversion circuit is supplied, for controlling the programming of the state flag.

With this structure, since the number of the erase operations and verify operations to be repeated until the nonvolatile memory cell is judged to be sufficiently erased is stored in the erase operation storage section and the read time can be set by the read time setting circuit according to the number of the erase operations and the verify operations stored in the erase operation storage section, the read time can be set according to the time needed for erasure so that the prolongation of the erase time can be restrained.

A nonvolatile semiconductor memory device of a third aspect of the present invention comprises a plurality of nonvolatile memory cells, which can be electrically programmed or erased, the plurality of nonvolatile memory cells divided into a plurality of blocks, a block erase circuit for erasing the plurality of nonvolatile memory cells contained in the plurality of blocks at the same time per block; erase operation times storage section for storing the number of erase operations of the nonvolatile memory cells to be erased at the same time by the block erase circuit per block in a number of erase operation storage region, a sense amplifier for sensing and amplifying the data in the memory cells via the bitline, and a read current setting section connected to the bitline for setting the read current based on the number of the erase operations stored in the number of erase operation storage region at the time of reading the storage data in the nonvolatile memory cells.

In the third embodiment, it is preferable that (1) The read current setting section decreases the read current according to the increase of the number of erase verify operations.

(2) The operation of reading the storage data in the nonvolatile memory cells having the next steps, 1) reading number of erase operations in the past, 2) deterring a discharge time of a bitline based on the read number of erase operations, and 3) latching data of a memory cell on the bitline after the determined time in a sense amplifier register.

With the above configurations, the following advantage can be obtained.

(1) Since the number of erase operations is stored by providing an erase operation storage region in a part of the memory cell array, enlargement of the circuit size can be restrained.

(2) Since the number of erase operations can be stored per block, the read time can be controlled finely per block according to the number of the erase operations.

(3) Since the page read time is extended, the prolongation of the erase time can be restrained when the nonvolatile memory cell starts deteriorating and the number of erase operations becomes large.

A nonvolatile semiconductor memory device according to a fourth aspect of the present invention comprises a memory cell array comprising a plurality of nonvolatile memory cells, which can be electrically programmed or erased, arranged in a matrix form, and having a data storage region for storing ordinary data and an erase operation times storage region for storing the number of erase operations in the past, a row address buffer to which a row address signal is supplied, a row decoder for decoding the output signal from the row address buffer and selecting the nonvolatile memory cell in the memory cell array per page, a sense amplifier register circuit for amplifying and latching the page read data from the nonvolatile memory cell selected by the row decoder, a column address buffer to which a column address signal is supplied, a column decoder for controlling the sense amplifier register circuit by decoding the output signal from the column address buffer, a control circuit for controlling the row decoder, the column decoder, and the sense amplifier register circuit based on the control signal inputted from the outside of the device, and an read operation control circuit for controlling the page read operation of the sense amplifier register circuit based on the number of erase operations stored in the erase operation times storage region. Since the number of the erase operations carried out by the nonvolatile semiconductor memory device is stored in the erase operation storage region in a part of the memory cell array and the page read time of the sense amplifier register circuit is prolonged by the erase operation control circuit according to the number of the erase operations, the prolongation of the erase time can be restrained even when the nonvolatile memory cell starts deteriorating and the number of erase operations becomes large.

In the fourth aspect of the present invention, it is preferable that the erase operation control circuit comprises a delay circuit delaying the page read operation start signal, a counter circuit for supplying the output signal from the delay circuit by the delay circuit as the increment signal, a time control circuit for supplying the state flag data according to the number of erase operations, and a comparator for comparing the output signals from the counter circuit and the time control circuit, and outputting the trigger signal to the delay circuit for starting in the case they are not identical or the page read operation terminate signal in the case they are identical so as to latch the bitline potential to the sense amplifier register circuit.

A reading method of a nonvolatile semiconductor memory device of the present invention comprises the steps of reading the number of erase operations in the past stored in the inside, determining a discharge time of a bitline based on the read number of erase operations, and latching data of a memory cell on the bitline after the determined discharge time in the sense amplifier register. According to the reading method, since the number of the erase operations carried out by the nonvolatile semiconductor memory device is stored and the read time is controlled according to the number of the erase operations, the prolongation of the erase time can be prevented by extending the read time when the nonvolatile semiconductor memory device has carried out the programming and erase operations more than a predetermined number.

As heretofore mentioned, according to the present invention, a nonvolatile semiconductor memory device capable of conducting the optimum erasure according to the number of the programming and erase operations, and restraining the prolongation of the erase time according to the increase of the number of the erase operations, and an erasing method thereof can be obtained.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE SEVERAL VIEWS OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE INVENTION

Hereinafter embodiments of the present invention will be explained with reference to accompanied drawings.

Figure 5:
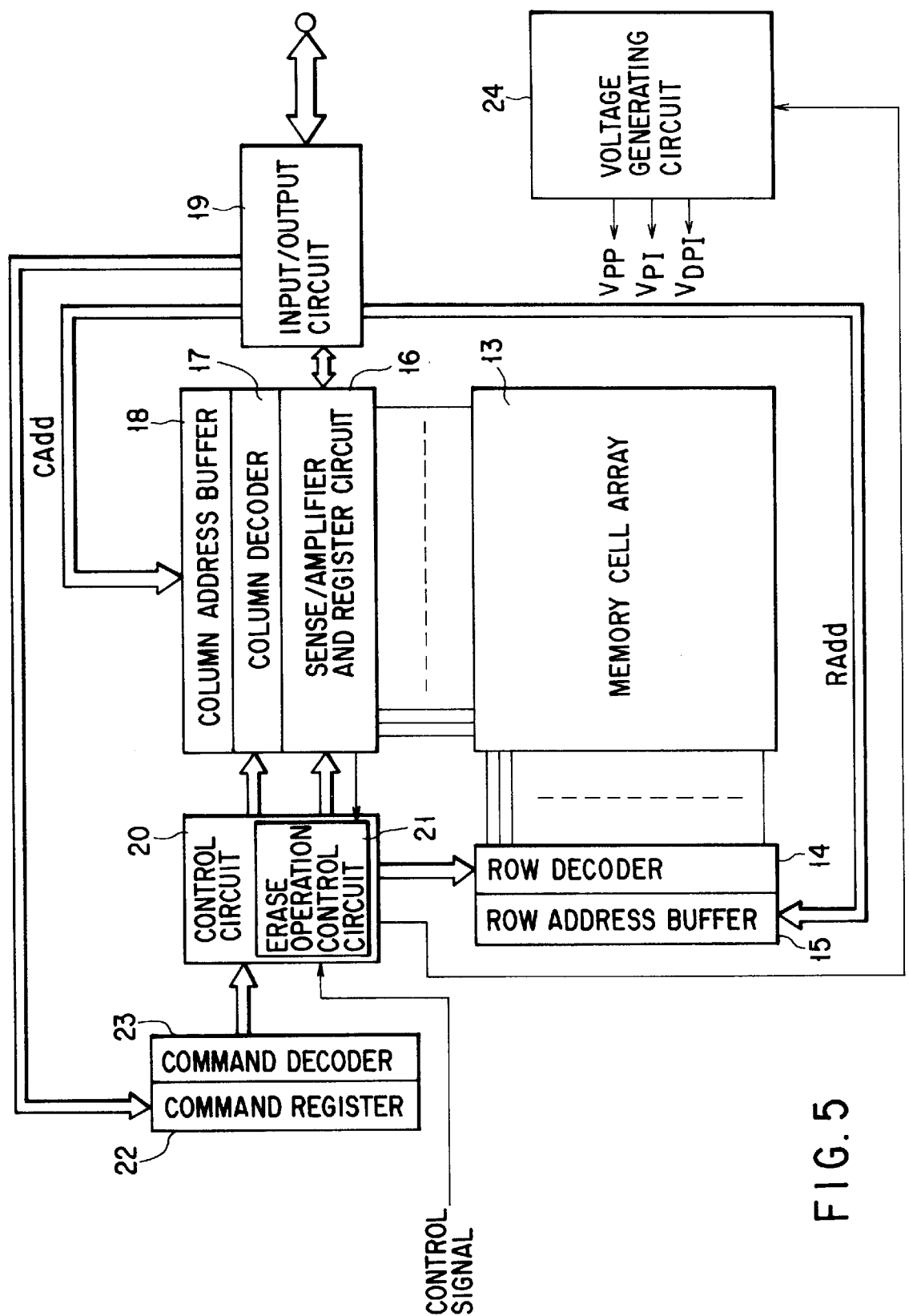
FIG. 5 is a block diagram showing the schematic configuration of a nonvolatile semiconductor memory device of a first embodiment of the present invention.

FIG. 5 is a block diagram showing the schematic configuration of a nonvolatile semiconductor memory device of a first embodiment of the present invention. In FIG. 5, a memory cell array 13, a row decoder 14, a row address buffer 15, a sense amplifier register circuit 16, a column decoder 17, a column address buffer 18, an input/output circuit 19, a control circuit 20, an erase operation control circuit 21, a command register 22, a command decoder 23, and a voltage generating circuit 24 are shown.

The memory cell array 13 comprises NAND bundles formed from n pieces of memory cells with the electric current paths connected in series, a source select gate and a drain select gate (select transistor) provided at the source end and the drain end of the series-connected electric current path, arranged in a matrix.

A row address signal (page address) $R_{Add}$ is supplied to the row address buffer 15 from the above-mentioned input/output circuit 19. The row address signal $RA_{dd}$ taken by the row address buffer 15 is decoded by the row decoder 14 so that the decode signal is supplied to the memory cell array 13 via a word line and a select line. Accordingly, an NAND bundle for one row in the memory cell array 13, and the memory cells of one row (one page) in the NAND bundle are selected.

A column address signal $CA_{dd}$ is supplied to the column address buffer 18 from the above-mentioned input/output circuit 19. The column address signal $CA_{dd}$ taken by the column address buffer 18 is decoded by the column decoder 17 so that the sense amplifier register circuit 16 is driven by the decoded signal. Data read out by the sense amplifier register circuit 16 from the memory cell array 13 via the bitline are outputted per a page unit via the input/output circuit 19.

Various kinds of commands from the outside of the device are inputted to the command register 22 via the input/output circuit 19. The commands taken by the command register 22 are decoded by the command decoder 23 and supplied to the control circuit 20. Various control signals are inputted to the control circuit 20. Based on the control signals and the commands supplied from the command decoder 23, the sense amplifier register circuit 16, the row decoder 14, the column decoder 17, the voltage generating circuit 24, and the like are controlled.

The voltage generating circuit 24 raises the power source voltage so as to generate a high voltage $V_{PP}$ (about 20 V), an intermediate voltage $V_{PI}$ (about 10 V), and a write prohibition drain voltage $V_{DPI}$ (about 10 V) and supplies them into the chip.

An erase operation control circuit 21 is provided in the control circuit 20 in the present invention. The erase operation control circuit 21 controls the page read time by the controlling the sense amplifier register circuit 16 according to the number of erase operations counted by the erase operation counter so that the page read time is prolonged when programming/erase operations more than a predetermined number are carried out.

Figure 6:
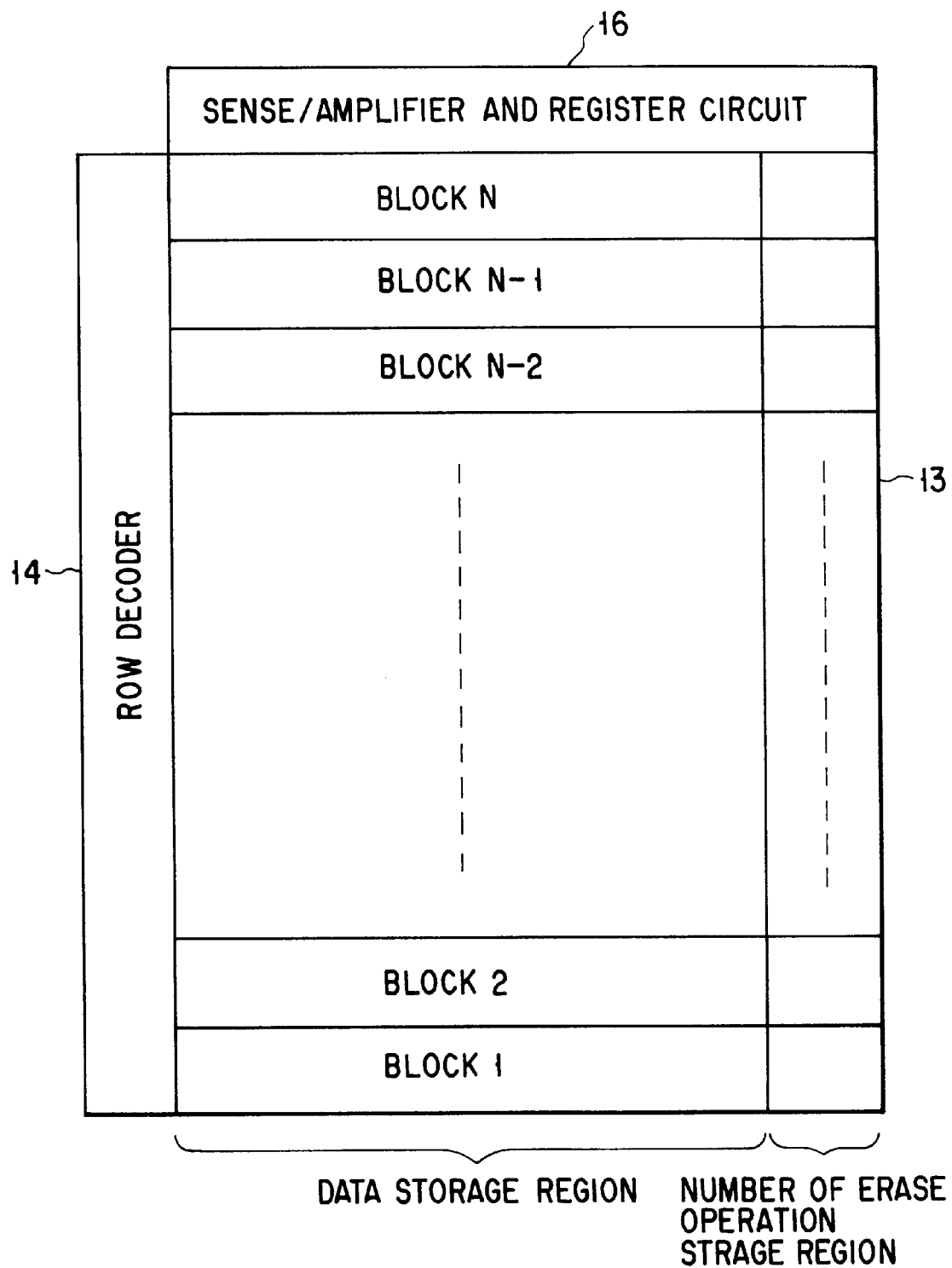
FIG. 6 is a block diagram showing a configuration example of the memory cell array shown in FIG. 5.

FIG. 6 is a block diagram showing a configuration example of the memory cell array shown in FIG. 5.

The memory cell array 13 comprises a data storage region and an erase operation times storage region. The data storage region is a region, divided in N pieces of blocks for storing ordinary data. The erase operation times storage region stores the number of times of erasure in the past for each block corresponding to the data storage region.

Figure 7:
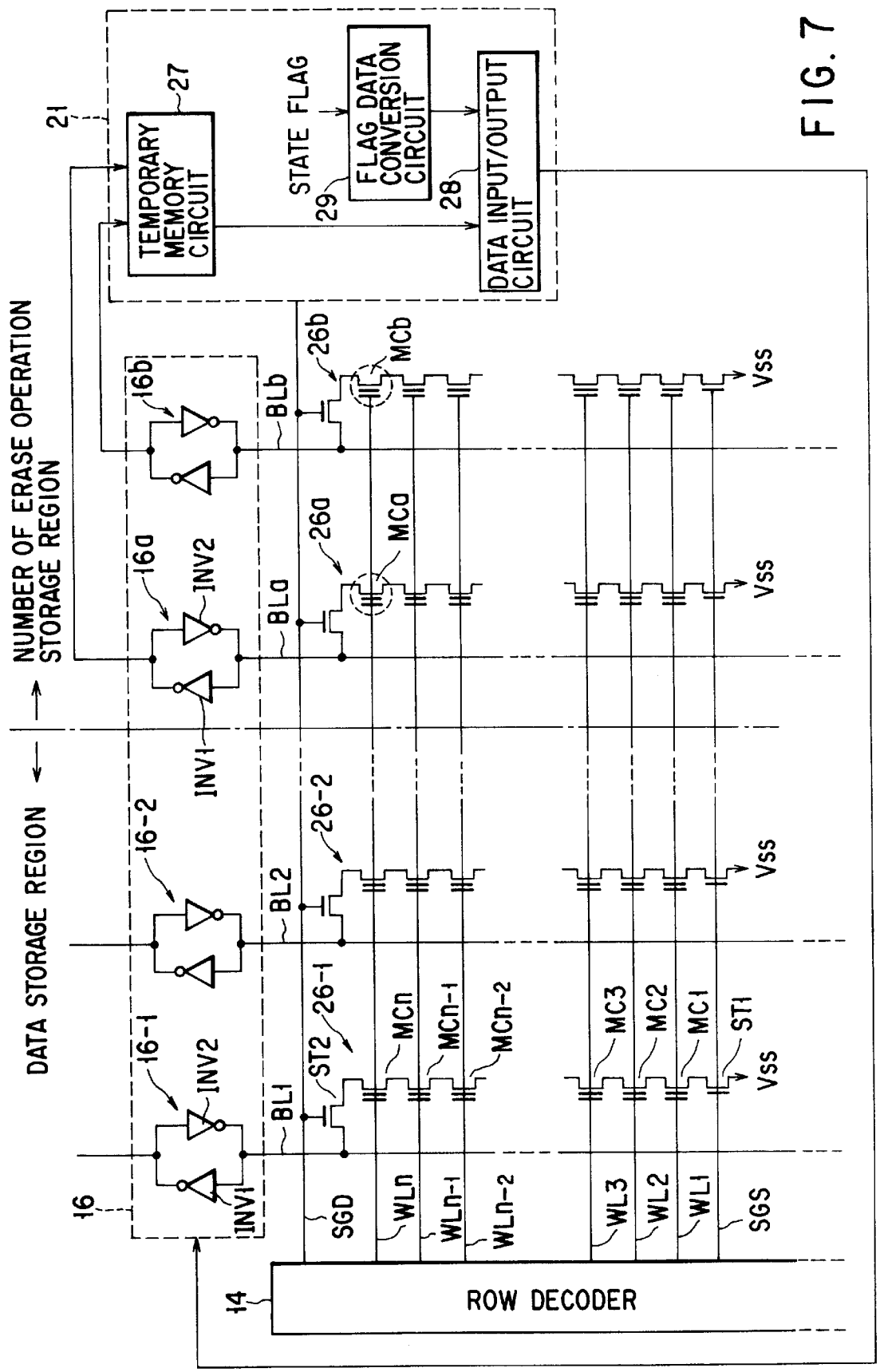
FIG. 7 is a circuit diagram showing the detailed configuration of an example of a memory cell array, paying attention to one block in FIG. 6.

FIG. 7 is a circuit diagram showing the detailed configuration of an example of a memory cell array, paying attention to one block in FIG. 6.

The basic memory cell configuration of the data storage region and the erase operation times storage region is the same as an ordinary NAND type flash memory except for data to be stored. That is, to each bitline BL1, BL2, . . . in the data storage region, NAND bundles 26-1, 26-2, . . . comprising electric current paths of a select transistor ST1, memory cells MC1 to MCn and a select transistor ST2 series-connected are connected. Similarly, to each bitline BLa, BLb in the erase operation times storage region, NAND bundles 26a, 26b comprising electric current paths of a select transistor ST1, memory cells MC1 to MCn and a select transistor ST2 series-connected are connected. The select line SGS is connected to the gate of each select transistor ST1 arranged on the same row. The word lines WL1 to WLn are connected to the control gate of each memory cell MC1 to MCn arranged on the same row. The select line SGD is connected to each select transistor ST2 arranged on the same row. The above-mentioned select line SGS, the word lines WL1 to WLn and the select line SGD are driven by the row decoder 14.

To the above-mentioned bit lines BL1, BL2, . . . , BLa, BLb, the sense amplifier register circuits 16-1, 16-2, . . . , 16a, 16b comprising inverters INV1 and INV2 are connected. The output from the above-mentioned sense amplifier register circuits 16a, 16b in the erase operation times storage region is supplied to the erase operation control circuit 21. The erase operation control circuit 21 comprises a temporary memory section 27, a data input/output circuit 28 and a flag data conversion circuit 29. To the temporary memory section 27, the output from the sense amplifier register circuits 16a, 16b is supplied. An output signal from the temporary memory section 27 is supplied to the above-mentioned data input control circuit 28. The data input control circuit 28 controls the sense amplifier register circuit 16 based on the output signal from the flag data conversion circuit 29 for converting the flag data of the state flag, and the output signal from the temporary memory section 27 so that the page read time is prolonged when the programming/erase operations are carried out for more than a predetermined number.

In the above-mentioned first embodiment, two NAND bundles are allotted for the erase operation times storage region in one block of the memory cell array 13. With one NAND bundle comprises a memory cell of 16 bits, among two NAND bundles of 32 bits, 2 bits are allotted for storing the read time control data, and 20 bits are allotted for storing the number of erase operations from the remainder. The 20 bits for storing the number of erase operations are rewritten for each erasure, with the number of erase operations stored as binary information. A flag for defining the read time calculated from the number of erase operation is stored in the 2 bits for read time control data (2 bits for reading). For example, in the example shown in FIG. 7, four kinds of information are stored using the memory cells MCa and MCb for the 2 bits for reading. The number of erase operations is stored by corresponding the states 1 to 4 with the state of data in the memory cells MCa and MCb with the number of block erasure up to 100,000 times is allotted for the state 1, from 100,000 times to 300,000 times for the state 2, from 300,000 times to 1,000,000 times for the state 3, and from 1,000,000 or more times for the state 4.

The method for storing the number of erase operations and the control method at the time of reading using the nonvolatile semiconductor memory device with the above-mentioned configuration will be explained.

Figure 8:
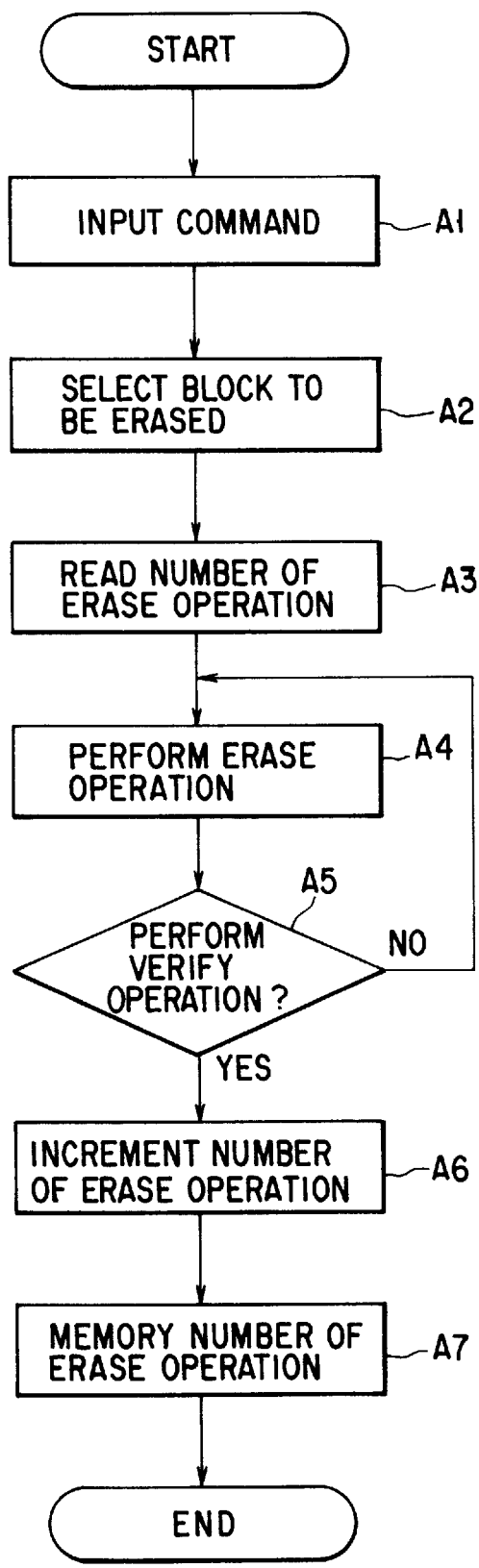
FIG. 8 is a flow chart showing the sequence of the internal operations in a block erasure.

FIG. 8 is a flow chart showing the sequence of the internal operations in a block erasure.

Usually, in an NAND type flash memory, a command inputted from the outside via the input/output circuit 19 is received at the command register 22, decoded by the command decoder 23, supplied to the control circuit 20 (step A1). An erase address is inputted from the outside via the input/output circuit 19 and the row address is latched by the row address buffer 15 so as to select the erase block (step A2).

In order to read the information of the number of erase operations stored in the selected block, the page read operation is carried out, and the read data are latched in the sense amplifier register circuits 16a, 16b. By repeating the operation, total 32 bits data are read out from the page 1 to the page N. The page read information are stored in the temporary memory section 27 for temporarily storing the information and retained in the temporary memory section 27 until completing the erase operations. By repeating the operations for the erase blocks, all data of the number erase operation storage region of each erase block are transferred to the temporary memory section 27 (step A3).

In the case of an NAND type flash, erasure is carried out by applying a high voltage pulse to a memory cell for about 5 =1 msec (step A4). After the erase operation, whether or not the threshold voltage of all the memory cells in the selected block are erased to a negative threshold voltage is checked by the verify mode operation (step A5). If all the memory cells are erased to a predetermined threshold level according to the result of the verify operation, the flag signal is outputted and the verify operation is completed. On the other hand, if there is a memory cell erased insufficiently, it returns to the step A4 to carry out the erase operation and verify operation again, and the erasure and the verification are repeated until achieving the sufficient erase state. If a sufficient erase state is detected according to the result of the verify operation, the number of erase operations of the selected block retained in the temporary memory section 27 is increased by one (step A6), and the erase number storage operation for programming the erase number storage region of the erased block is carried out (step A7). In this case, the erase number information incremented by one is written in the 20 bits for the erase number storage, and the new state flag is stored in the 2 bits (memory cells MCa, MCb) according to the incremented new number of erase operations.

The flag data conversion circuit shown in FIG. 7 is a circuit for generating flag data based on the erase operation storage information incremented by one, and the output data form the flag data conversion circuit 29 and the erase number information increased by one are inputted to the data input control circuit 28. Based on the output data from the data input control circuit 28, data of the sense amplifier register in the erase operation times storage region are set, and the number of erase operations and the read time control data are stored in the erase operation times storage region.

Figure 9:
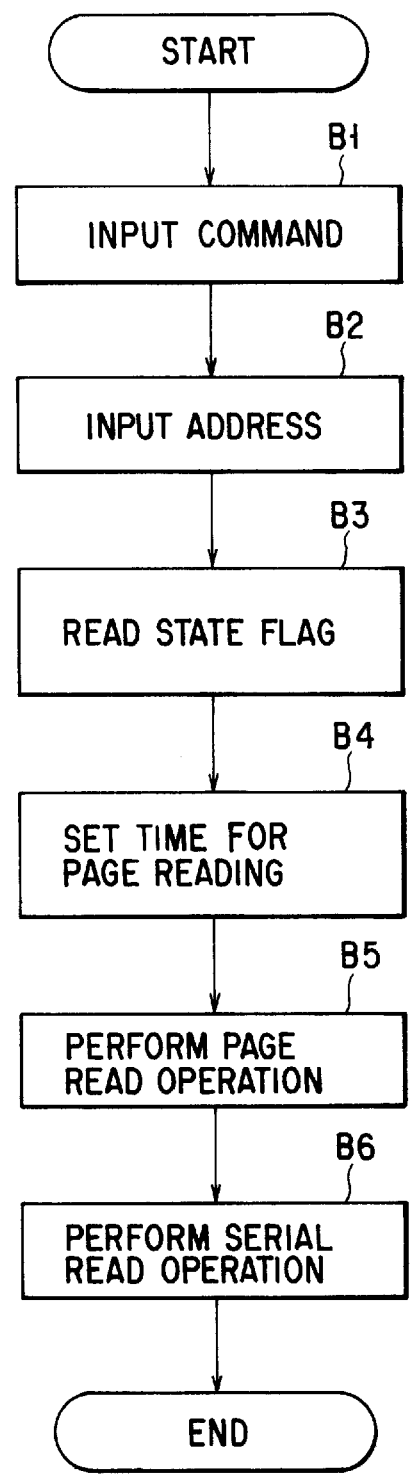
FIG. 9 is a flow chart showing the read sequence.

The read sequence will be explained with reference to the flow chart in FIG. 9.

After inputting the read command (step B1), the page address to be read is inputted from the outside (step B2). First, data of the state flag stored in the N page of the block including the addressed page are read (step B3).

Based on the value of the state flag stored in the memory cells MCa and MCb, the page read time is determined (step B4). For example, since the number of erase operations is less than 100,000 times if the state flag is "1", the cell to be erased is sufficiently erased to the predetermined threshold voltage Vth, and the page read time is set to be Tr. Since the number of erase operations is less than 300,000 times if the state flag is "2", even a memory cell with a shallow threshold voltage can be regarded as "1" data by setting the page read time at twice time 2 Tr. If the state flag is "3" or "4", even a memory cell with a further shallow threshold voltage can be regarded as "1" data by setting the page read time at 5 Tr or 10 Tr, respectively.

Then based on the page read time set at the step B4, the page read operation (step B5), the serial read operation (step B6) are carried out.

Figure 10:
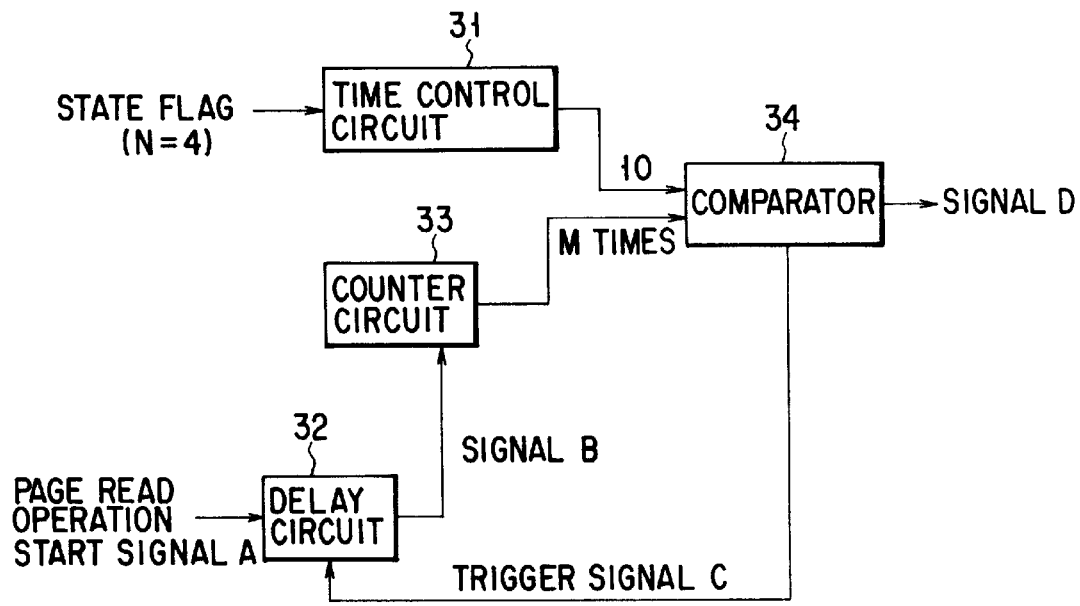
FIG. 10 is a circuit diagram showing an example of a circuit for setting the page read time by the value of the state flag.
Figure 11:
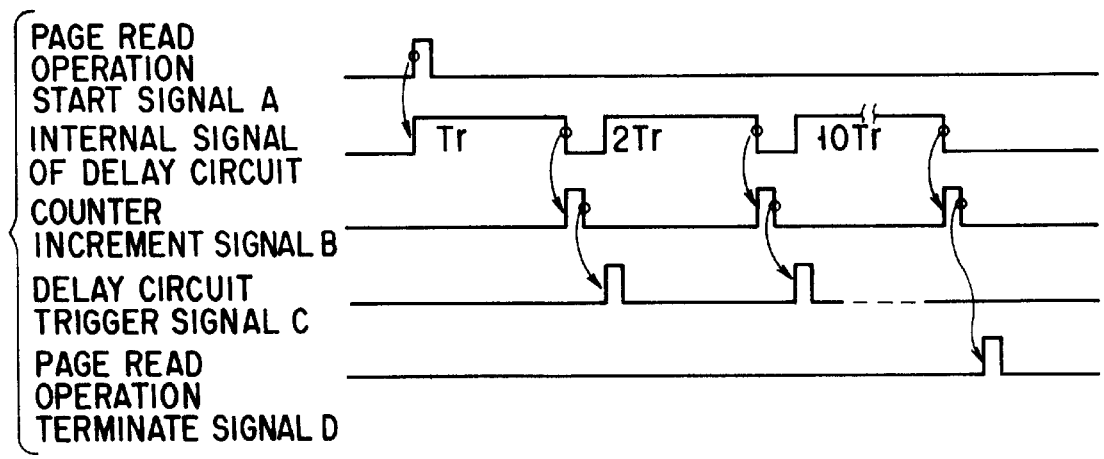
FIG. 11 is a timing chart of each signal in the circuit shown in FIG. 10.

FIG. 10 shows an example of a configuration of a circuit for setting the page read time by the value of the state flag, and FIG. 11 is a timing chart of each signal in the circuit shown in FIG. 10.

This circuit comprises a time control circuit 31 for inputting the state flag read from each block, a delay circuit 32 for inputting the page read operation start signal A, a counter circuit 33 for supplying the delay signal by the delay circuit 32 as the counter increment signal B, and a comparator 34 for comparing the output signals from the time control circuit 31 and the counter circuit 33 and outputting the trigger signal C of the delay circuit 32 or the page read operation terminate signal D.

The delay circuit 32 is provided such that it is triggered by the page read operation start signal A so that the internal signal is raised to a high level but is lowered to a low level after a predetermined time Tr. Subject to the internal signal becoming the low level, the counter increment signal (pulse signal) B is outputted from the delay circuit 32. According to the signal B, the value counted by the counter circuit 33 is incremented. The count number is outputted from the counter circuit 33.

The time control circuit 31 is a circuit for outputting a value for controlling the page read time Tr according to the value of the state flag read in the step B3 and stored in the temporary memory section 27. It outputs "1", "2", "5", "10" when the state flag is "1", "2", "3", "4", respectively. The count output from the counter circuit 33 and the value of the time control circuit 31 are compared by the comparator 34, and if they are not identical, a trigger signal C for starting the delay circuit 32 again is outputted. If they are identical, a page read operation terminate signal D is outputted from the comparator 34 in place of the trigger signal C so as to terminate the reading operation of the data in the bitline and latch the level of the bitline BL in the sense amplifier register circuit 16. For example, as shown in FIG. 10, if the state flag N is 4 times, the page read operation terminate signal D is outputted when the output M from the counter circuit 33 becomes 10.

Figure 12:
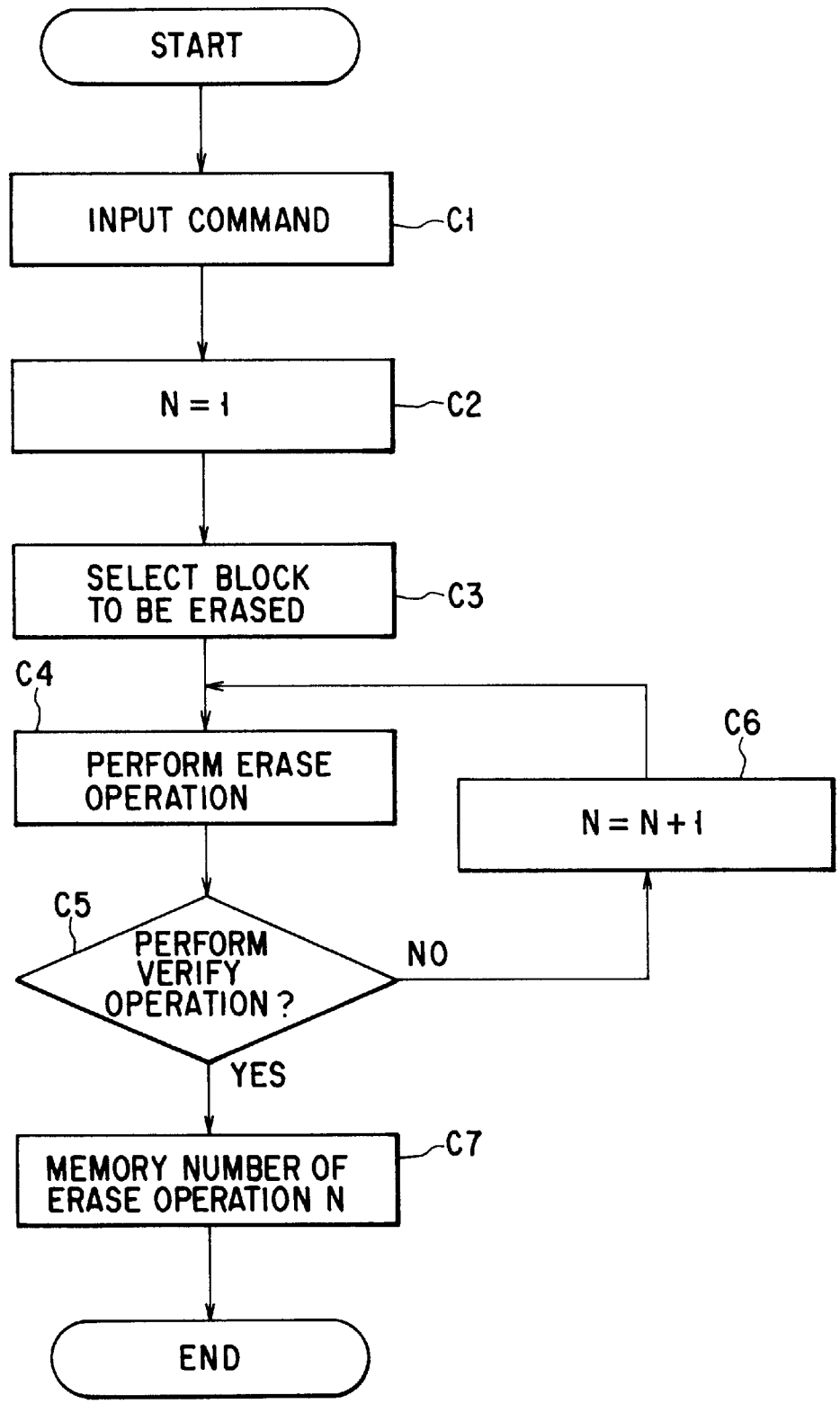
FIG. 12 is a flow chart showing the erase sequence, for explaining a nonvolatile semiconductor memory device of a second embodiment of the present invention and an erasing method thereof.

FIG. 12 is a flow chart showing the erase sequence, for explaining a nonvolatile semiconductor memory device of a second embodiment of the present invention and an erasing method thereof. Since the configuration of this embodiment is the same as the first embodiment, a figure or explanation will be omitted.

In the first embodiment, the page read time is set by storing the number of erase operations in the past in the erase operation times storage region whereas in the second embodiment, the page read time is set by monitoring the time needed for erasure (time needed for completely erasing all the memory cells in the block). That is, after inputting a command (step C1), "1" is set in the internal counter for temporarily storing the number of erase operations as the counted value N (step C2). Then the erase block is selected by inputting the address of the block to be erased (step C3).

The erase operation is carried out for a certain time (step C4), and the verify operation is carried out whether or not all the memory cells are erased (step C5). If a memory cell insufficiently erased is detected by this verify operation, the internal counter is incremented by one (step C6) so as to carry out the erase operation again. The erase and verify operations are carried out until all the memory cells are erased. If all the memory cells are judged to be erased by the verify operation, a predetermined value based on the counted value N by the internal counter is stored in the nonvolatile memory section (step C7).

As the nonvolatile memory section, a memory cell adjacent to the ordinary data storage region may be used, or a nonvolatile memory may be provided in a peripheral circuit other than the data storage region. The predetermined value can be set as mentioned below.

Since the threshold voltage of the memory cell is sufficiently deep if the number of programming/erase operations is less than 100,000 times, a sufficient erase state can be detected at the first verify operation so that the counted value N of the internal counter indicates "1". If the number of the programming/erase operations is not less than 100,000 times and less than 300,000 times, the erase operation needs to be carried out twice so that the counted value N of the internal counter indicates "2". Furthermore, if the number of the programming/erase operations is not less than 300,000 times and less than 1,000,000 times, the erase operation needs to be carried out three times to five times, and if the number of the programming/erase operations is not less than 1,000,000 times, the erase operation needs to be carried out six times or more. Therefore, if the counted value N is "1", "1" is stored in the nonvolatile memory section, and if the counted value N is "2", "2" is stored. Further, if the counted value N is from "3" to "5", "5" is stored. If it is "6" or more, "10" is stored. By reading the data in the nonvolatile memory section at the time of reading, and providing this data in place of the output signal from the time control circuit 31 shown in FIG. 10, the page read time can be set according to the number of erase operations per block.

Although the number of the total erase operations is not counted in such configuration and erasing method, since the total number of erase operations can be predicted by counting how many erase operations are carried out in a predetermined time to achieve the complete erase state in all the memory cells in the block, the effect the same as the first embodiment can be achieved.

Figure 1:
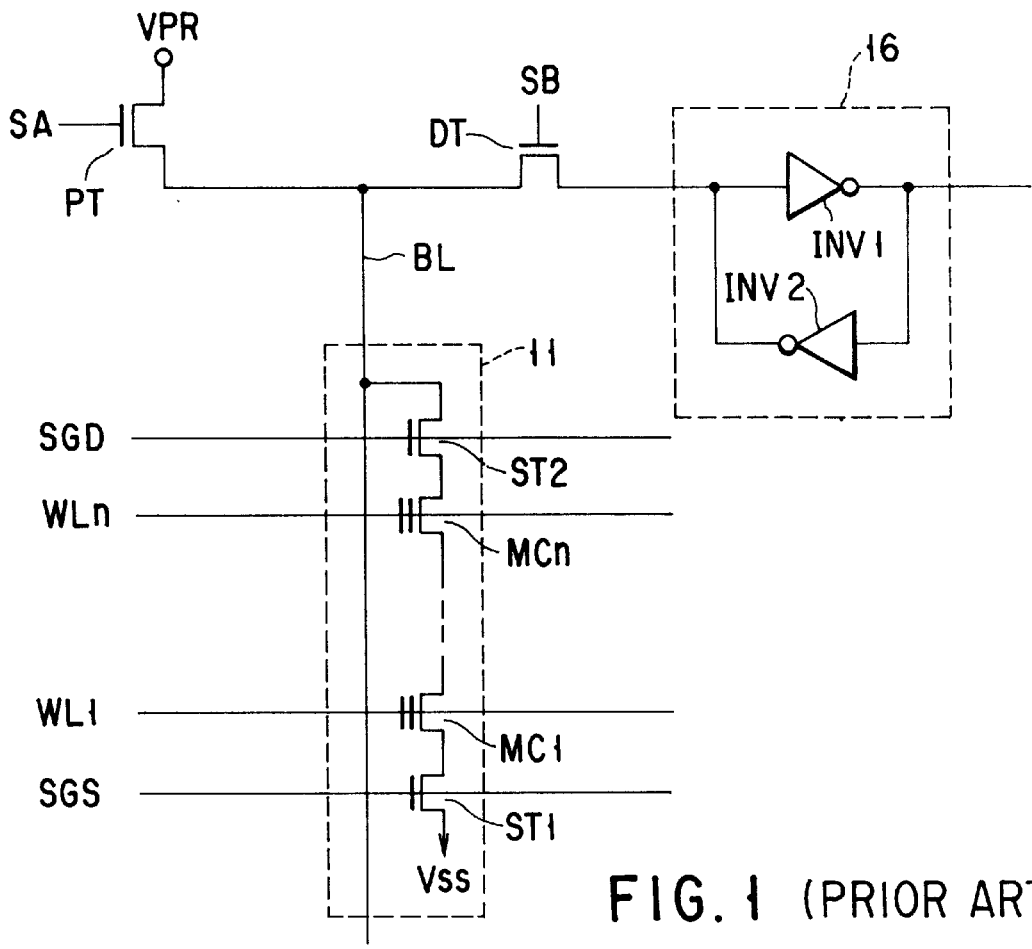
FIG. 1 is a circuit diagram schematically showing the memory cell in an NAND type flash memory and the surrounding circuit section related to the read operations.
Figure 2:
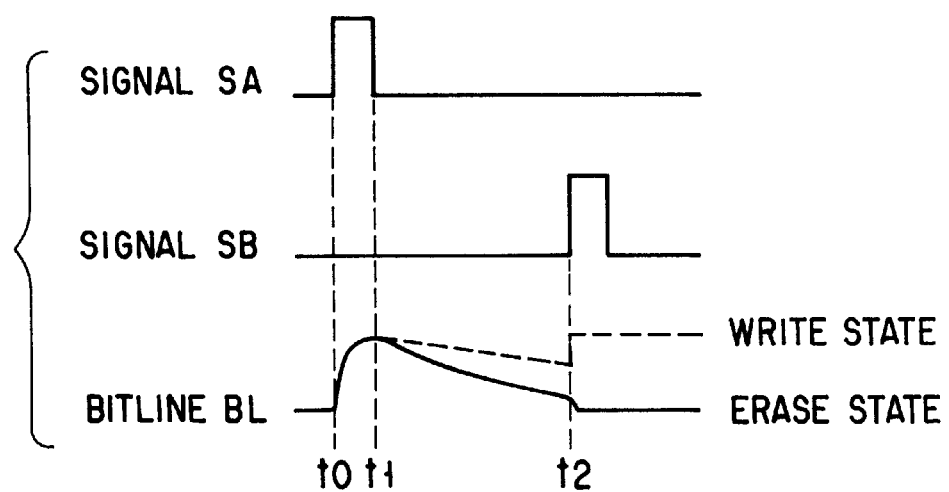
FIG. 2 is a timing chart for explaining the read operation in the circuit shown in FIG. 1.
Figure 3:
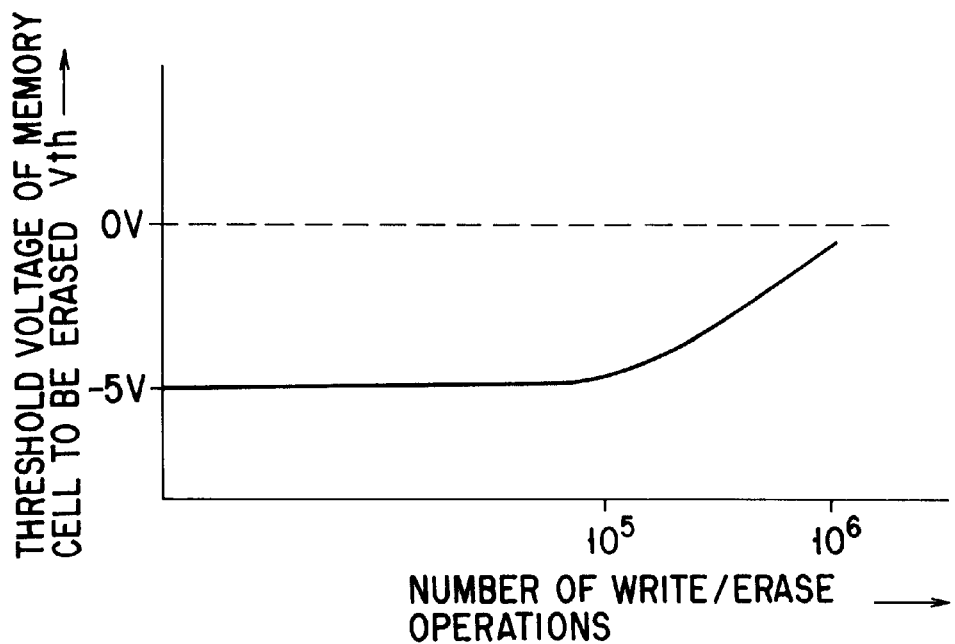
FIG. 3 is a graph showing the dependency of the threshold voltage after erasing the memory cell with respect to the number of programming/erase operations.
Figure 4:
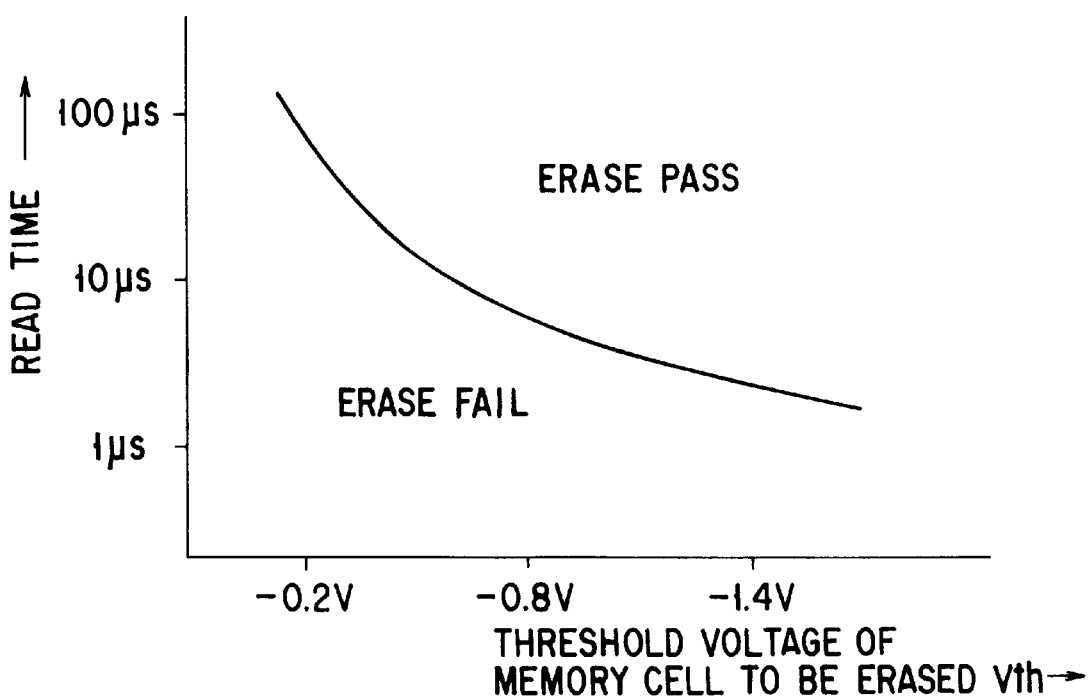
FIG. 4 is a graph showing the relationship between the threshold voltage after the erasing the memory cell and the page read time.
Figure 13:
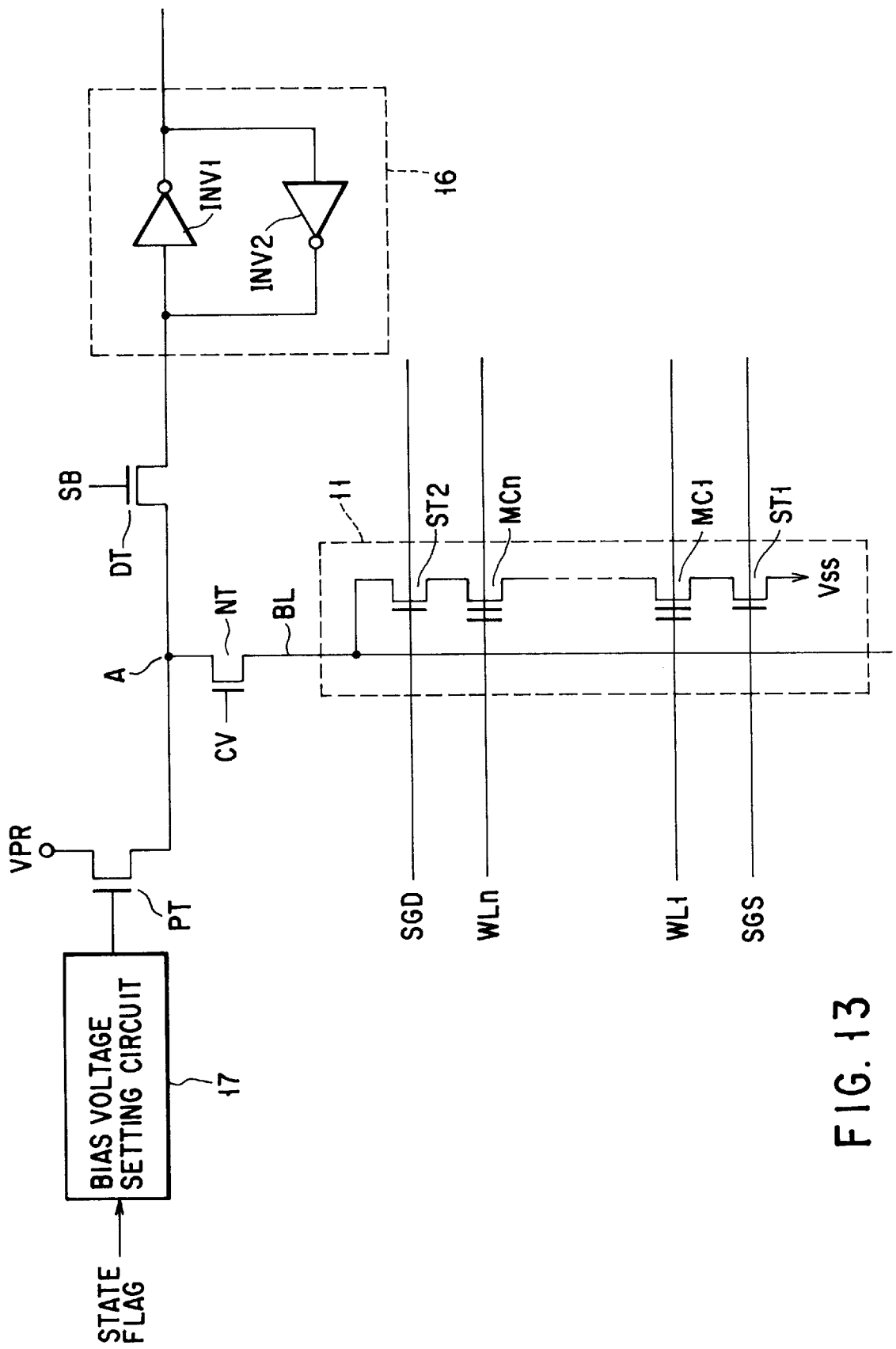
FIG. 13 is a diagram showing the schematic configuration of a third embodiment where an electric current detecting type sense method is adopted in the first and second embodiments of the present invention.

FIG. 13 shows a schematic configuration of a third embodiment adopting the electric current detecting type sense method as the sense method in the above-mentioned first and second embodiments. In FIG. 13, the sections the same as FIG. 1 are applied with the same numerals and detailed explanation will be omitted.

In FIG. 13, an n-channel transistor NT provided with a certain voltage CV at the gate is inserted between the bitline and the sense node A. The transistor NT functions as the amplifying transistor for the node A. Further, the n-channel transistor PT is connected to the node A as the load transistor for controlling the electric current flowing to the memory cell. As in FIG. 1, a transistor DT is connected between the node A and the sense amplifier register circuit 16.

Conventionally, only on/off of the precharge transistor PT is controlled, whereas, in the present invention, the electric current flowing in the load transistor PT is changed by changing the voltage applied to the gate of the load transistor PT by the bias voltage setting circuit 17. Since the potential of the node A is determined by the balance between the electric current flowing in the load transistor PT and the electric current flowing in the memory cell, it is possible to cope with the threshold value change of the memory cell MC by changing the electric current flowing in the load transistor PT.

For example, in the case the electric current flowing in the load transistor PT is controlled to be I2 by controlling the gate voltage of the load transistor PT, the potential of the node A is at a high level with the electric current I1 flowing in the memory cell MC in the erase state smaller than I2. In this case, by minimizing the electric current flowing in the load transistor PT, even if the electric current flowing in the memory cell MC is small, it can be judged to be the erase state. However, since the time for charging the capacity of the bitline BL becomes longer if the electric current I2 of the load transistor PT is set to be small, it involves a problem in that the page read time becomes longer as well.

In order to solve the problem, in this embodiment, the bias voltage by the bias voltage setting circuit 17 for controlling the gate voltage of the load transistor PT is controlled by the result of the number of the programming/erase operations. In the bias voltage setting circuit 17, since data of the state flag shown in the first and second embodiments are inputted so that the bias voltage setting circuit 17 changes the gate voltage of the load transistor PT based on the data of the state flag, the electric current value I2 of the load transistor PT is controlled. With a small number of the programming/erase operations, the electric current value I2 of the load transistor PT is set to be large. However, with a certain value or more of the programming/erase operations, the electric current value I2 of the load transistor PT is set to be small. That is, by the bias voltage setting circuit 17, with a small number of the programming/erase operations, the gate voltage is set such that the electric current I2 of the load transistor PT is set to be large, but with a predetermined value or more of the programming/erase operations, the gate voltage is set such that the electric current I2 of the load transistor PT becomes small. At the same time, read time is set to long period. As a consequence, the problem of prolonged time for erasure can be solved even if the number of the programming/erase operations is increased.

Although an example of setting the page read time Tr to be twice with the number of programming/erase operations of not more than 300,000 times, 5 times with not more than 1,000,000 times, and further 10 times with more than 1,000,000 times is explained in the above-mentioned embodiment, since the value varies depending upon the oxide film thickness, the quality of the oxide film, and the like, it is preferable to optimize the value according to each device.

As heretofore mentioned, according to the present invention, it is possible to restrain the erase time to be short even if the nonvolatile memory cell is too deteriorated to be sufficiently erased so that the life of the nonvolatile semiconductor memory device can be prolonged.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

We claim:

1. A nonvolatile semiconductor memory device comprising:

a plurality of nonvolatile memory cells, which can be electrically programmed and erased, the plurality of nonvolatile memory cells divided into a plurality of blocks;

a block erase circuit for erasing the plurality of nonvolatile memory cells contained in the plurality of blocks at the same time per block;

erase operation times storage means for storing a number of erase operations previously performed on a block of the nonvolatile memory cells by the block erase circuit, the number of erase operations stored in a number of erase operation storage region of nonvolatile memory cells; and read time setting means for setting a read time based on the number of the erase operations stored in the number of erase operation storage region at the time of reading storage data in the nonvolatile memory cells.

2. The nonvolatile semiconductor memory device according to claim 1, wherein the read time setting means prolongs the page read time according to an increase of the number of erase operations stored in the number of erase operation storage region.

3. The nonvolatile semiconductor memory device according to claim 1, wherein an operation of reading the storage data in the nonvolatile memory cells includes the steps, 1) reading a number of past erase operations, 2) determining a discharge time of a bitline based on the read number of erase operations, and 3) latching data of a memory cell on the bitline after the determined time in a sense amplifier register.

4. The nonvolatile semiconductor memory device according to claim 1, wherein the block erase circuit comprises erase address storage means for storing an erase address inputted from outside of the device, and an erase block select circuit for selecting a block to be erased based on the erase address stored in the erase address storage means.

5. The nonvolatile semiconductor memory device according to claim 1, wherein the erase operation times storage means comprises an erase operation counter incremented according to the number of erase operations.

6. The nonvolatile semiconductor memory device according to claim 1, wherein the read time setting means includes a pulse generating circuit for generating a reference pulse for predetermined period, a counter circuit for counting generating times of the reference pulse, and a comparison circuit for comparing an output of the counter circuit with a predetermined value corresponding to the number of erase operations in the past, wherein if a predetermined result is identified, the comparison circuit outputs a read termination signal and, if not, outputs a signal for generating a next reference pulse from the pulse generating circuit.

7. The nonvolatile semiconductor memory device according to claim 1, wherein a memory cell array is formed by arranging the nonvolatile memory cells in a matrix form, and the memory cell array comprises a data storage region for storing ordinary data and the number of erase operation times storage region for storing the number of erase operations of the memory cell in the past.

8. The nonvolatile semiconductor memory device according to claim 1, wherein the erase operation times storage region stores the number of erase operations in the past for each block corresponding to the data storage region.

9. The nonvolatile semiconductor memory device according to claim 1, wherein the erase operation times storage means comprises a temporary memory section for temporarily storing the number of erase operations, a flag data conversion section for converting state flag data according to the number of erase operations, and a data input/output control section, to which an output signal from the temporary memory section and the output signal from the flag data conversion section are supplied, for controlling programming of the state flag and the number of erase operations.

10. A nonvolatile semiconductor memory device comprising:
a plurality of nonvolatile memory cells, which can be electrically programmed and erased, the plurality of nonvolatile memory cells divided into a plurality of blocks;
number of erase verify operation storage means for storing a number corresponding to a number of verify operations to be repeated until all the nonvolatile memory cells contained in a selected block are judged to be sufficiently erased in an erase verification; and
read time setting means for setting a read time based on the number corresponding to the number of verify operations stored in the erase verify operation times storage means at the time of reading the storage data in the nonvolatile memory cells.

11. The nonvolatile semiconductor memory device according to claim 10, wherein a memory cell array is formed by arranging the nonvolatile memory cells in a matrix form, and the memory cell array comprises a data storage region for storing ordinary data and a number of erase verify operation storage region for storing the number corresponding to the number of erase verify operations in the previous erase operation.

12. The nonvolatile semiconductor memory device according to claim 10, wherein the read time setting means prolongs a page read time according to an increase of the number of erase verify operations.

13. The nonvolatile semiconductor memory device according to claim 10, wherein of reading the storage data in the nonvolatile memory cells includes the steps,
1) reading the number corresponding to the number of previous erase verify operations in a previous erase operation,
2) determining a discharge time of a bitline based on the read number of erase operations, and
3) latching data of a memory cell on the bitline after the determined time in a sense amplifier register.

14. The nonvolatile semiconductor memory device according to claim 10, wherein the number of erase verify operation storage means comprises a flag data conversion circuit for converting state flag data according to the number of erase verify operations in previous erase operation, and a data input/output control circuit, to which an output signal from the flag data conversion circuit is supplied, for controlling programming of the state flag.

15. A nonvolatile semiconductor memory device comprising:
a plurality of nonvolatile memory cells, which can be electrically programmed or erased, the plurality of nonvolatile memory cells divided into a plurality of blocks,
a block erase circuit for erasing the plurality of nonvolatile memory cells contained in the plurality of blocks at the same time per block;
erase operation times storage means for storing a number of erase operations of the nonvolatile memory cells to be erased at the same time by the block erase circuit per block in a number of erase operation storage region,
a sense amplifier for sensing and amplifying data in the memory cells via a bitline, and
a read current setting means connected to the bitline for setting a read current based on the number of the erase operations stored in the number of erase operation storage region at the time of reading the data stored in the nonvolatile memory cells.

16. The nonvolatile semiconductor memory device according to claim 15, wherein the read current setting means decreases the read current according to an increase of the number of erase operations.

17. The nonvolatile semiconductor memory device according to claim 15, wherein reading the data from the nonvolatile memory cells includes the steps,
1) reading a number of erase operations in the past,
2) determining a discharge time of a bitline based on the read number of erase operations, and
3) latching data of a memory cell on the bitline after the determined time in a sense amplifier register.

18. A nonvolatile semiconductor memory device comprising:
a memory cell array comprising a plurality of nonvolatile memory cells, which can be electrically programmed or erased, arranged in a matrix form, and having a data storage region for storing ordinary data and an erase operation times storage region for storing a number of erase operations in the past,
a row address buffer to which a row address signal is supplied,
a row decoder for decoding an output signal from the row address buffer and selecting the nonvolatile memory cell in the memory cell array per page,
a sense amplifier register circuit for amplifying and latching the data read from the nonvolatile memory cell selected by the row decoder,
a column address buffer to which a column address signal is supplied,
a column decoder for controlling the sense amplifier register circuit by decoding an output signal from the column address buffer,
a control circuit for controlling the row decoder, the column decoder, and the sense amplifier register circuit based on a control signal inputted from outside of the device, and
a read operation control circuit for controlling a page read operation of the sense amplifier register circuit based on a number of erase operations stored in the erase operation times storage region.

19. The nonvolatile semiconductor memory device according to claim 18, wherein the control circuit comprises;
a delay circuit delaying a page read operation start signal, a counter circuit receiving an output signal from the delay circuit as an increment signal, a time control circuit for supplying state flag data according to the number of erase operations, and a comparator for comparing the output signals from the counter circuit and the time control circuit, and outputting a trigger signal to the delay circuit for starting when the output signals are not identical or the page read operation terminate signal when the output signals are identical so as to latch a bitline potential to the sense amplifier register circuit.

20. An erasing method of a nonvolatile semiconductor memory device comprising the steps of:

reading a number of pst erase operations stored in nonvolatile memory cells with the device, determining a discharge time of a bitline based on the read number of erase operations, and latching data of a memory cell on the bitline in a sense amplifier register after the determined discharge time.

* * * * *